(12) United States Patent
Yosui et al.

(10) Patent No.: US 10,993,329 B2
(45) Date of Patent: Apr. 27, 2021

(54) BOARD JOINT STRUCTURE

(71) Applicant: Murata Manufacturing Co., Ltd., Nagaokakyo (JP)

(72) Inventors: Kuniaki Yosui, Nagaokakyo (JP); Daisuke Tonaru, Nagaokakyo (JP); Hideyuki Taguchi, Nagaokakyo (JP); Genro Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/910,226

(22) Filed: Jun. 24, 2020

(65) Prior Publication Data

US 2020/0323085 A1    Oct. 8, 2020

Related U.S. Application Data

(63) Continuation of application No. PCT/JP2018/047602, filed on Dec. 25, 2018.

(30) Foreign Application Priority Data

Dec. 28, 2017  (JP) .............................. JP2017-254832

(51) Int. Cl.
 *H05K 1/02* (2006.01)
 *H05K 1/03* (2006.01)
 (Continued)

(52) U.S. Cl.
 CPC ............. *H05K 3/28* (2013.01); *H05K 1/0296* (2013.01); *H05K 1/03* (2013.01); *H05K 1/111* (2013.01);
 (Continued)

(58) Field of Classification Search
 CPC .......... H05K 3/28; H05K 1/0296; H05K 1/03; H05K 1/111; H05K 1/14; H05K 3/3494;
 (Continued)

(56) References Cited

U.S. PATENT DOCUMENTS 6,596,947 B1 * 7/2003 Kurita .................... H05K 1/036
                                                        174/251
2008/0251280 A1 * 10/2008 Shi ........................ H05K 3/363
                                                        174/254
(Continued)

FOREIGN PATENT DOCUMENTS

JP    03-176972 A     7/1991
JP    2008-071812 A   3/2008
(Continued)

OTHER PUBLICATIONS

Official Communication issued in International Patent Application No. PCT/JP2018/047602, dated Mar. 26, 2019.

*Primary Examiner* — Ishwarbhai B Patel
(74) *Attorney, Agent, or Firm* — Keating & Bennett, LLP

(57) ABSTRACT

A first board includes a first insulating substrate including a first main surface, a first electrode pad, and a first resist film. The first electrode pad is a conductor pattern provided on the first main surface. The first resist film is provided on the first main surface and is located closer to the first electrode pad than any conductor provided on the first main surface. The first resist film is spaced away from the first electrode pad with a gap provided between the first resist film and the first electrode pad. The first resist film is thicker than the first electrode pad.

14 Claims, 9 Drawing Sheets

(51) Int. Cl.
*H05K 1/11* (2006.01)
*H05K 1/14* (2006.01)
*H05K 3/28* (2006.01)
*H05K 3/34* (2006.01)
*H05K 3/36* (2006.01)
*H05K 1/18* (2006.01)

(52) U.S. Cl.
CPC ............ *H05K 1/14* (2013.01); *H05K 3/3494* (2013.01); *H05K 3/363* (2013.01); *H05K 1/028* (2013.01); *H05K 1/118* (2013.01); *H05K 1/147* (2013.01); *H05K 1/18* (2013.01); *H05K 2201/0129* (2013.01); *H05K 2201/0141* (2013.01); *H05K 2201/0154* (2013.01); *H05K 2201/057* (2013.01)

(58) Field of Classification Search
CPC ........... H05K 3/363; H05K 2201/0129; H05K 1/147; H05K 2201/0154; H05K 2201/0141; H05K 2201/057; H05K 1/028; H05K 1/118

See application file for complete search history.

(56) References Cited

U.S. PATENT DOCUMENTS

| | | | |
|---|---|---|---|
| 2015/0082629 A1* | 3/2015 | Kato | .................. H05K 1/148 29/860 |
| 2015/0087353 A1* | 3/2015 | Yosui | .................. H01B 13/06 455/550.1 |
| 2017/0033426 A1 | 2/2017 | Baba et al. | |

FOREIGN PATENT DOCUMENTS

| | | |
|---|---|---|
| JP | 2014-140012 A | 7/2014 |
| WO | 2016/088592 A1 | 6/2016 |
| WO | 2017/061369 A1 | 4/2017 |

* cited by examiner

BOARD JOINT STRUCTURE

CROSS REFERENCE TO RELATED APPLICATIONS

This application claims the benefit of priority to Japanese Patent Application No. 2017-254832 filed on Dec. 28, 2017 and is a Continuation Application of PCT Application No. PCT/JP2018/047602 filed on Dec. 25, 2018. The entire contents of each application are hereby incorporated herein by reference.

BACKGROUND OF THE INVENTION

1. Field of the Invention

The present invention relates to a board joint structure that is joined by application of heat and pressure using a hot bar.

2. Description of the Related Art

A conventional structure where a board such as a cable is joined to a mount board is known (WO 2016/088592 A).

The board is heated and pressed against the mount board by a hot bar or the like to be joined to the mount board with solder. In particular, when a board having flexibility is joined by reflow soldering or the like, the board easily deforms at the time of being mounted. Therefore, it is suitable for the board to be joined to the mount board by a hot bar or the like.

However, when the board is joined to the mount board by the above-described method, solder (hereinafter, referred to as a conductive joint material) may be scattered from a joint section during application of heat and pressure (at the time of joining). Alternatively, the conductive joint material may be wet-spread over an unnecessary portion. These may lead to a short circuit at the joint section or changes in electrical characteristics of the board and the mount board.

SUMMARY OF THE INVENTION

Preferred embodiments of the present invention provide board joint structures that are each able to significantly reduce or prevent a change in characteristics due to scattering or wet-spreading of a conductive joint material at the time of joining the board, even when a board is joined to a mount board or the like by a hot bar or the like.

A board joint structure according to a preferred embodiment of the present invention includes a board, and a mounting board, in which the board includes a first insulating substrate including a first main surface, a first electrode pad provided on the first main surface, and a first resist film provided on the first main surface and located closer to the first electrode pad than any conductor provided on the first main surface. The first resist film is spaced away from the first electrode pad with a gap provided between the first resist film and the first electrode pad and is thicker than the first electrode pad. The mounting board includes a second insulating substrate including a second main surface, and a second electrode pad provided on the second main surface. The first main surface faces the second main surface with the first resist film interposed between the first main surface and the second main surface, and the first electrode pad and the second electrode pad are joined together with a conductive joint material.

During application of heat and pressure by a hot bar (at the time of joining the board to the mounting board), the first resist film defines and functions as a bank to significantly reduce or prevent scattering or excessive wet-spreading of the conductive joint material from a joint section between the first electrode pad and the second electrode pad. Therefore, a change in characteristics due to scattering or excessive wet-spreading of the conductive joint material during application of heat and pressure is able to be significantly reduced or prevented.

Further, since the first resist film located closer to the first electrode pad than any conductor provided on the first main surface is thicker than the first electrode pad, application of excessive pressure to the joint section between the first electrode pad and the second electrode pad during application of heat and pressure by the hot bar is able to be significantly reduced or prevented. This in turn further significantly reduces or prevents scattering or excessive wet-spreading of the conductive joint material from the above-described joint section during application of heat and pressure.

The mounting board preferably includes a second resist film provided on the second main surface and located closer to the second electrode pad than any conductor provided on the second main surface. Further, the second resist film is preferably spaced away from the second electrode pad with a gap provided between the second resist film and the second electrode pad and thicker than the second electrode pad. Further, the first main surface preferably faces the second main surface with the first resist film and the second resist film interposed between the first main surface and the second main surface. Accordingly, scattering or excessive wet-spreading of the conductive joint material from the above-described joint section is able to be further reduced or prevented during application of heat and pressure.

The first insulating substrate is preferably flexible. Accordingly, even when the board comes into contact with the mounting board to which the board is mounted during application of heat and pressure by the hot bar, the first insulating substrate is able to be deformed (for example, to define or function as a shock absorber) to significantly reduce or prevent damage to the board.

The second insulating substrate is preferably flexible. Accordingly, even when the board comes into contact with the mounting board during application of heat and pressure by the hot bar, the second insulating substrate is able to be deformed (for example, to define or function as a shock absorber) to significantly reduce or prevent damage to the board or the mounting board. Further, since both the first insulating substrate and the second insulating substrate are flexible, the above-described advantageous features and effects are further improved.

According to preferred embodiments of to the present invention, boards are provided that are able to be significantly reduce or prevent a change in characteristics due to scattering or wet-spreading of the conductive joint material even when the board is joined to a mount board or the like by a hot bar or the like.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
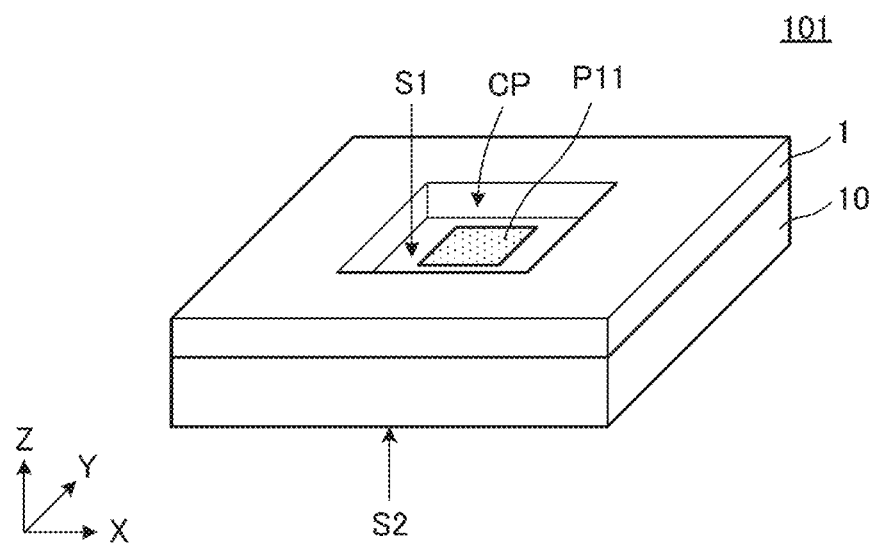
FIG. 1A is an external perspective view of a first board 101 according to a first preferred embodiment of the present invention.

Hereinafter, a plurality of preferred embodiments for carrying out the present invention will be described with reference to the drawings and some specific examples. In the drawings, the same portions are denoted by the same reference numerals. Although the preferred embodiments will be described separately, for the sake of convenience, in consideration of easy explanation or understanding of the gist, some components shown in different preferred embodiments may be replaced or combined. In second and subsequent preferred embodiments, no description will be provided of points common to a first preferred embodiment, and only differences will be described. In particular, no description will be provided of the same advantageous features and effects of the same or similar components or elements one by one for each preferred embodiment.

First Preferred Embodiment

Figure 1B:
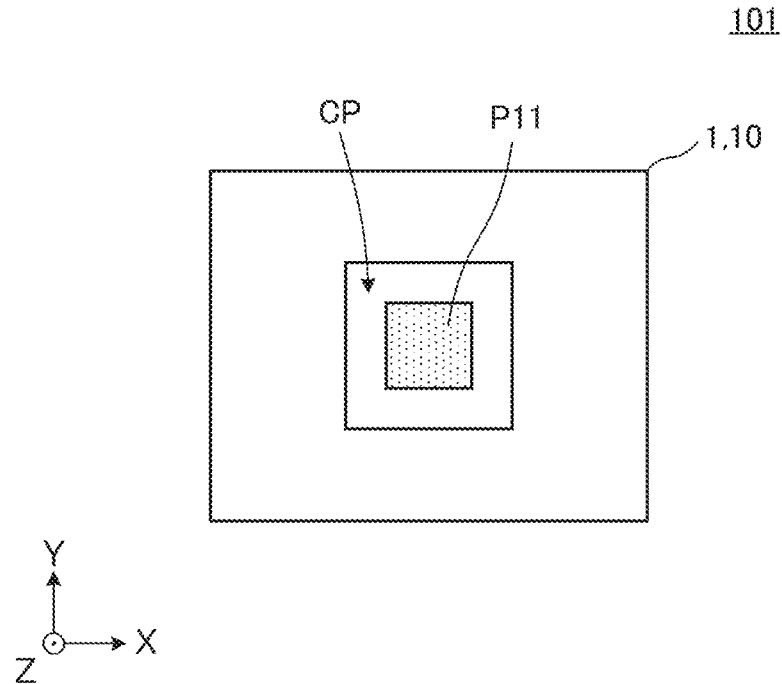
FIG. 1B is a plan view of the first board 101.
Figure 2:
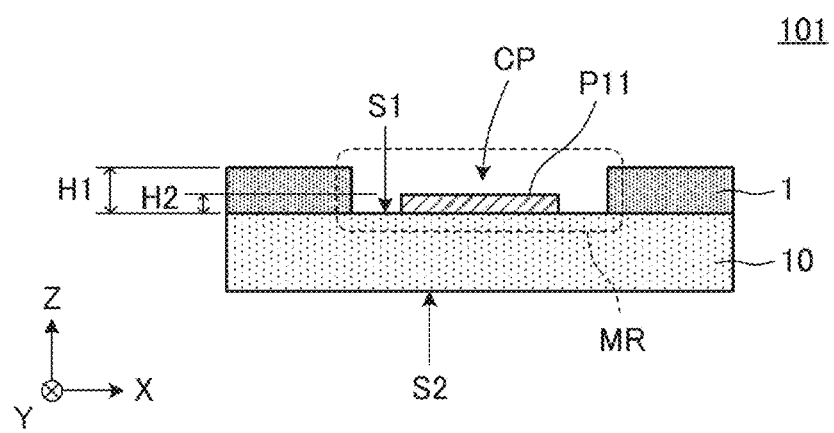
FIG. 2 is a cross-sectional view of the first board 101.

FIG. 1A is an external perspective view of a first board 101 according to a first preferred embodiment of the present invention, and FIG. 1B is a plan view of the first board 101. FIG. 2 is a cross-sectional view of the first board 101. In FIGS. 1A and 1B, a first electrode pad P11 is shown in the form of a dot pattern for easy understanding of the structure.

The first board 101 includes a first insulating substrate 10, the first electrode pad P11, a first resist film 1, and the like. Note that the first board 101 includes elements or components (a conductor, a component, or the like, for example) in addition to those described above, but the components or elements are not shown.

The first insulating substrate 10 is a cuboid or substantially cuboid insulating element and includes main surfaces S1, S2 on opposite sides of the first insulating substrate 10. Specifically, the first insulating substrate 10 is, for example, a resin flat plate primarily including a resin material (thermoplastic resin, for example) and having flexibility. The first insulating substrate 10 is a flat plate preferably primarily including, for example, a liquid crystal polymer (LCP) or polyetheretherketone (PEEK).

In the first preferred embodiment, the main surface S1 of the first insulating substrate 10 corresponds to a "first main surface".

The first electrode pad P11 is a rectangular or substantially rectangular conductor pattern provided on the main surface S1. The first electrode pad P11 is preferably a conductor pattern made of, for example, a Cu foil.

The first resist film 1 is a protective film provided all or substantially all over the main surface S1 and located closer to the first electrode pad P11 than any conductor provided on the main surface S1. The first resist film 1 includes an opening CP at a position corresponding to the first electrode pad P11. Therefore, providing the first resist film 1 on the main surface S1 exposes the first electrode pad P11. As shown in FIGS. 1A, 1B, and 2, the first resist film 1 is spaced away from the first electrode pad P11 with a gap provided between the first resist film 1 and the first electrode pad P11. That is, the first resist film 1 has a clearance resist structure with respect to the first electrode pad P11.

The first resist film 1 is a solder resist film preferably made of a thermosetting resin, for example, an epoxy resin (EP). The first resist film 1 includes, for example, a thermosetting resin applied to the main surface S1 and then cured. Further, the first resist film 1 may be a coverlay film made of, for example, polyimide (PI) or polyethylene terephthalate (PET). Such a first resist film 1 may include, for example, a patterned film applied to the main surface S1, or may include a film applied to the main surface S1 and then patterned. In the present specification, "close to the first electrode pad" means that the first resist film is located closer to the first electrode pad than any of the conductors provided on the main surface S1 is. That is, a case where the shortest distance between the first resist film and the first electrode pad is smaller than the shortest distance between any of all the conductors provided on the main surface S1 and the first electrode pad is referred to as "the first resist film is "close to the first electrode pad"".

As shown in FIG. 1B, the first resist film 1 surrounds an entire or substantially an entire circumference of the first electrode pad P11 in plan view of the main surface S1 (when viewed along a Z-axis). Further, as shown in FIG. 2, a thickness (H1: thickness along the Z-axis orthogonal or substantially orthogonal to the main surface S1) of the first resist film 1 is larger than a thickness (H2) of the first electrode pad P11 (H1>H2).

Figure 3:
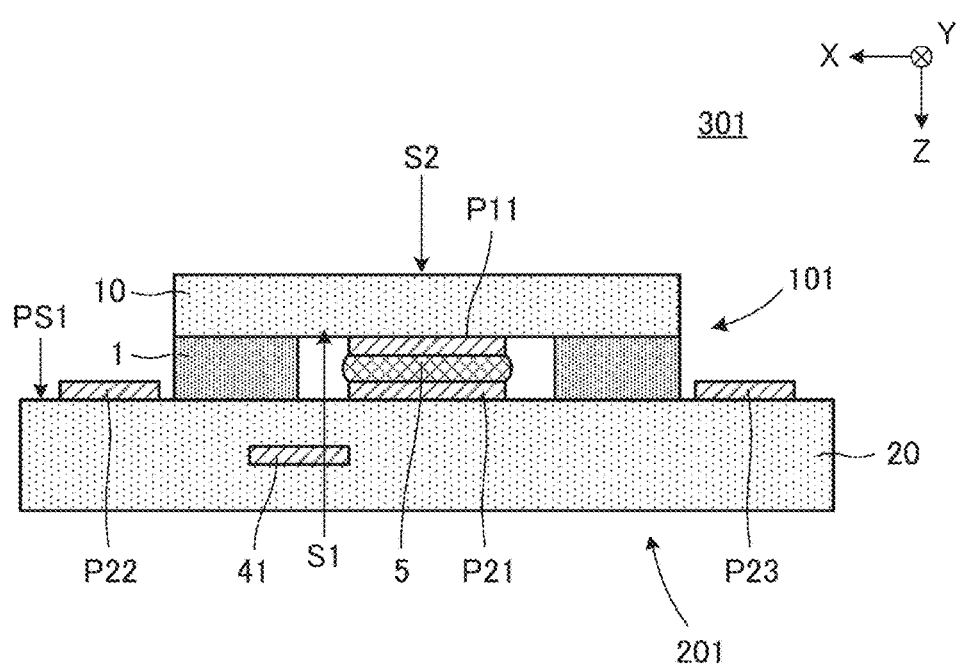
FIG. 3 is a cross-sectional view of a main portion of an electronic device 301 according to the first preferred embodiment of the present invention.

Next, a description will be provided of the board joint structure of the first preferred embodiment with reference to the drawings. FIG. 3 is a cross-sectional view of a main portion of an electronic device 301 according to the first preferred embodiment.

The electronic device 301 includes the first board 101, the second board 201, and the like. The first board 101 is mounted on the second board 201. Note that a board other than the first board 101, an electronic component, and the like are mounted on the second board 201, but they are not shown.

The second board 201 includes a second insulating substrate 20, second electrode pads P21, P22, P23, a conductor 41, and the like. Note that the second board 201 includes components or elements (a conductor, a component, and the like, for example) in addition to those described above, but the components or elements are not shown. The second board 201 is a cuboid or substantially cuboid printed wiring board, for example, a glass/epoxy board.

In the first preferred embodiment, the second board 201 corresponds to a "mounting board".

The second insulating substrate 20 is a cuboid or substantially cuboid insulating element and has a main surface PS1. The second electrode pads P21, P22, P23 are rectangular or substantially rectangular conductor patterns provided on the main surface PS1. The conductor 41 is a conductor pattern provided in the second insulating substrate 20. The second electrode pads P21, P22, P23 and the conductor 41 are each preferably a conductor pattern made of, for example, a Cu foil.

In the first preferred embodiment, the main surface PS1 of the second insulating substrate 20 corresponds to a "second main surface".

As shown in FIG. 3, the main surface S1 (first main surface) of the first board 101 faces the main surface PS1 (second main surface) of the second board 201 with the first resist film 1 interposed between the main surface S1 and the main surface PS1. The first electrode pad P11 of the first board 101 and the second electrode pad P21 of the second board 201 are joined together with a conductive joint material 5. The conductive joint material 5 is preferably, for example, solder.

Figure 4A:
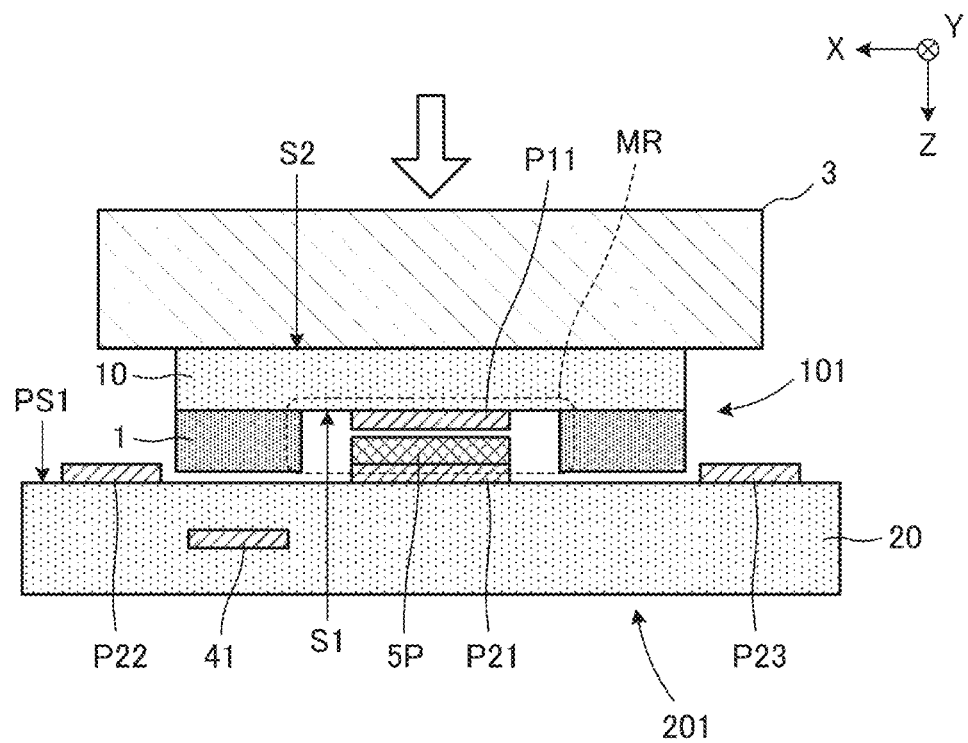
FIGS. 4A and 4B are cross-sectional views of the first board 101 and a second board 201 according to the first preferred embodiment of the present invention, sequentially showing a process of joining the first board 101 and the second board 201.
Figure 4B:
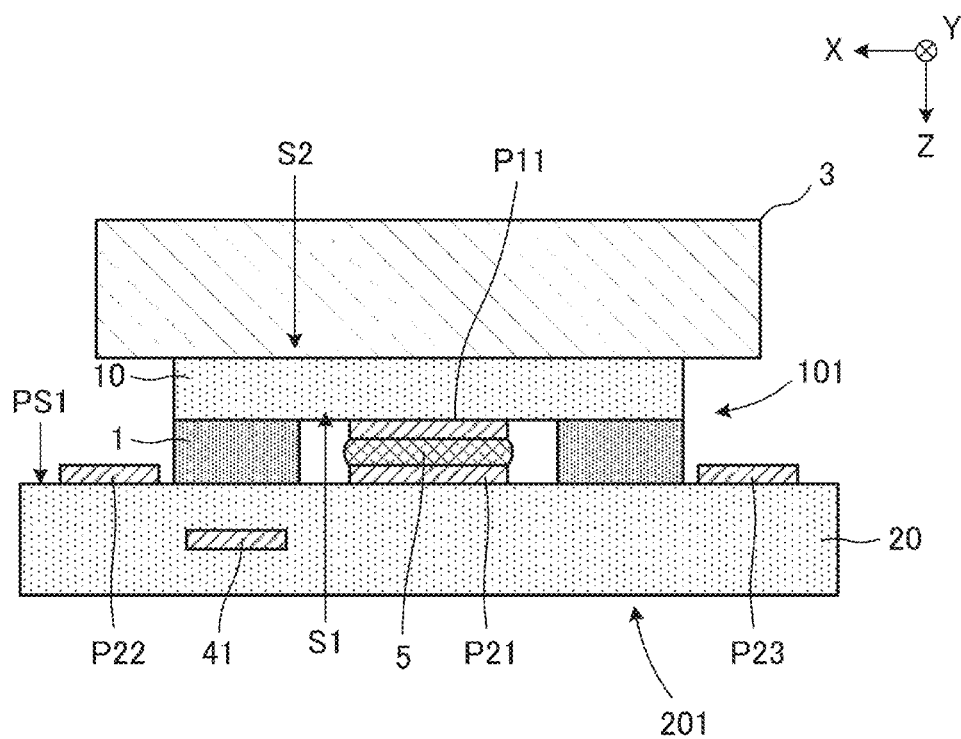

The first board 101 is joined to the second board 201 by, for example, a joining process described below. FIGS. 4A and 4B are cross-sectional views of the first board 101 and the second board 201 according to the first preferred embodiment, sequentially showing the process of joining the first board 101 and the second board 201.

First, as shown in FIG. 4A, the first board 101 and the second board 201 are prepared. Then, a conductive paste 5P is applied (or printed) to a surface of the second electrode pad P21 of the second board 201. The conductive paste 5P is preferably, for example, a solder paste.

Next, the first board 101 is held by suction by a hot bar 3 and then provided (placed) on the second board 201. Specifically, the first board 101 is provided on the second board 201 to cause the first electrode pad P11 of the first board 101 and the second electrode pad P21 of the second board 201 to face each other. At this time, the main surface S1 (first main surface) of the first insulating substrate 10 faces the main surface PS1 (second main surface) of the second board 201 with the first resist film 1 interposed between the main surface S1 and the main surface PS1.

Thereafter, the first board 101 is heated and pressed by the hot bar 3 in a stacking direction (+Z direction) (see a white arrow shown in FIG. 4A), thus joining the first board 101 to the second board 201. This in turn joins, as shown in FIG. 4B, the first electrode pad P11 of the first board 101 to the second electrode pad P21 of the second board 201 with the conductive joint material 5.

Figure 5A:
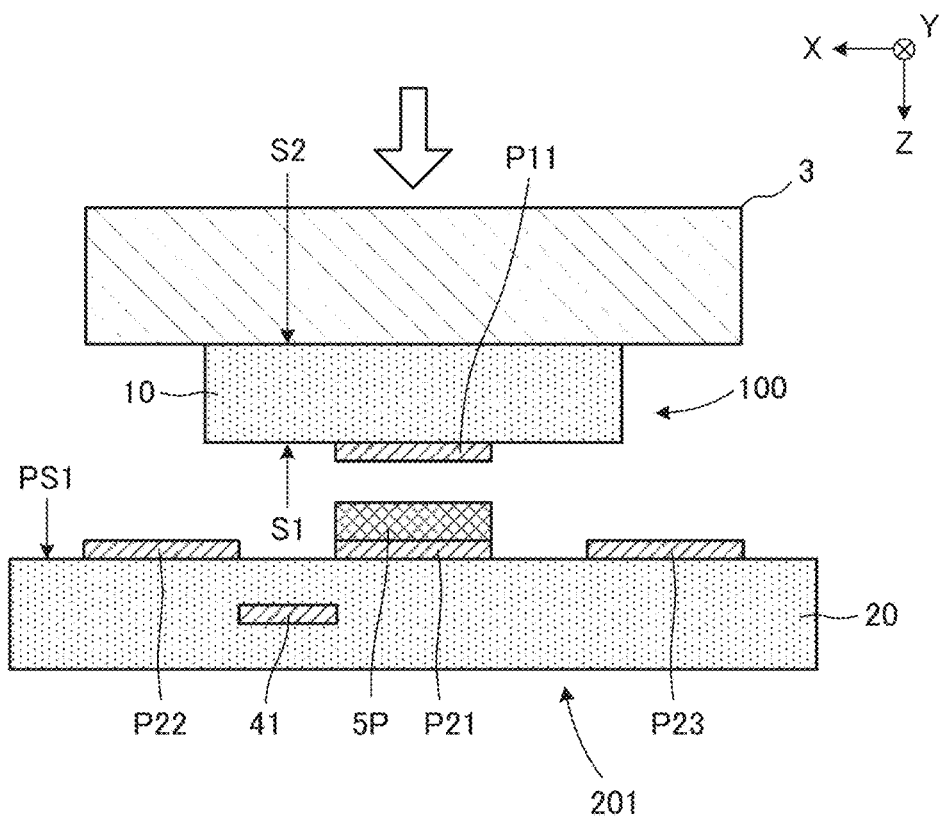
FIGS. 5A and 5B are cross-sectional views of a first board 100 having no first resist film and the second board 201, sequentially showing a process of joining the first board 100 and the second board 201 as a comparative example.
Figure 5B:
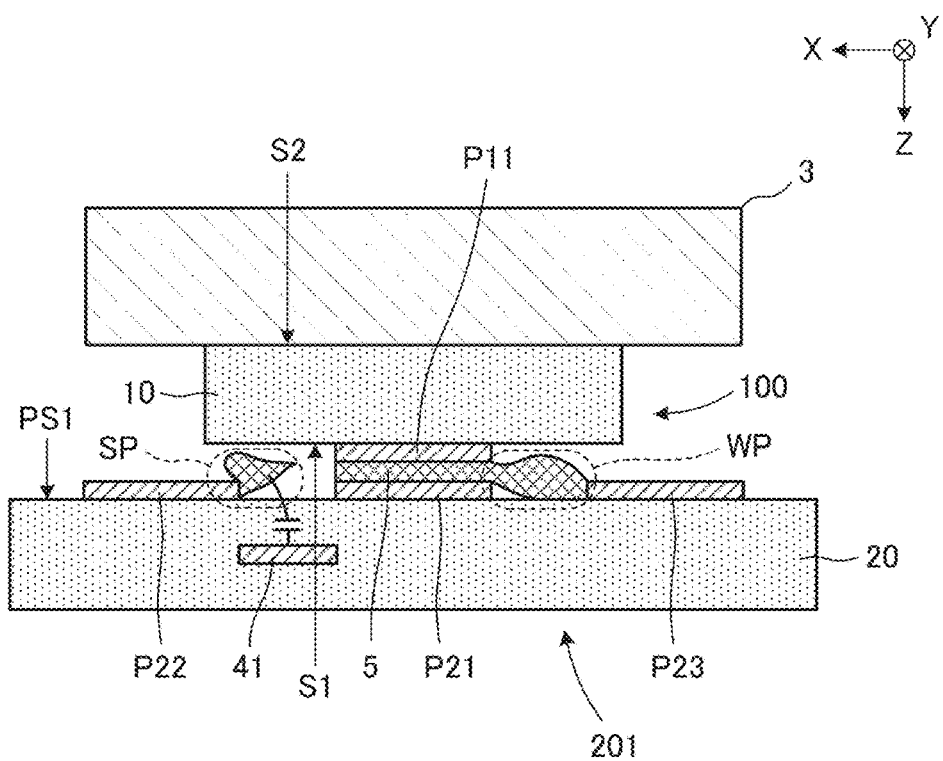

Next, a description will be provided of a process of joining the first board including no first resist film and the second board as a comparative example. FIGS. 5A and 5B are cross-sectional views of a first board 100 including no first resist film and the second board 201, sequentially showing the process of joining the first board 100 and the second board 201 as the comparative example. Note that the joining process shown in FIGS. 5A and 5B is the same or approximately the same as the joining process shown in FIGS. 4A and 4B; thus, no description will be provided of some of the joining process.

First, as shown in FIG. 5A, the first board 100 and the second board 201 are prepared. The first board 100 differs from the above-described first board 101 in that the first board 100 includes no first resist film. The first board 100 is identical or similar in other components, elements, and features as the first board 101. Then, the conductive paste 5P is applied (or printed) to the surface of the second electrode pad P21 of the second board 201.

Next, the first board 100 is held by suction by the hot bar 3 and then provided (placed) on the second board 201. Specifically, the first board 100 is provided on the second board 201 to cause the first electrode pad P11 of the first board 100 and the second electrode pad P21 of the second board 201 to face each other. At this time, the main surface S1 (first main surface) of the first insulating substrate 10 faces the main surface PS1 (second main surface) of the second board 201.

Thereafter, the first board 100 is heated and pressed by the hot bar 3 in a stacking direction (+Z direction) (see a white arrow shown in FIG. 5A), thus joining the first board 100 to the second board 201. This in turn joins, as shown in FIG. 5B, the first electrode pad P11 of the first board 100 to the second electrode pad P21 of the second board 201 with the conductive joint material 5.

As shown in FIGS. 5A and 5B, when the first board 100 including no first resist film is joined to the second board 201 by the hot bar 3, excessive pressure is applied to a joint section between the first electrode pad P11 and the second electrode pad P21 during application of heat and pressure. This may cause the conductive joint material to be scattered from the above-described joint section (see a scattered portion SP shown in FIG. 5B) or cause the conductive joint material to be excessively wet-spread from the joint section (see a wet-spread portion WP shown in FIG. 5B). This in turn may cause a short circuit at an unintended section (for example, a short circuit between the second electrode pads P21 and P23 shown in FIG. 5B) or may provide a capacitance between other conductors (for example, between the scattered portion SP and the conductor 41 shown in FIG. 5B). These lead to a change in electrical characteristics.

On the other hand, according to the first preferred embodiment, during application of heat and pressure by the hot bar 3 (at the time of joining the first board 101), the first resist film 1 defines and functions as a bank to significantly reduce or prevent scattering or wet-spreading of the conductive joint material from the joint section between the first electrode pad P11 and the second electrode pad P21 (to bring a scattering range of the conductive joint material into a joint range MR shown in FIG. 2). Therefore, a change in characteristics due to scattering or excessive wet-spreading of the conductive joint material during application of heat and pressure is able to be significantly reduced or prevented.

Further, according to the first preferred embodiment, as shown in FIG. 2, the thickness (H1) of the first resist film 1 located closer to the first electrode pad P11 than any conductor provided on the main surface S1 is larger than the thickness (H2) of the first electrode pad P11 (H1>H2). Excessive pressure is able to be significantly reduced or prevented from being applied to the joint section between the first electrode pad P11 and the second electrode pad P21 during application of heat and pressure by the hot bar 3. This in turn further reduces or prevents scattering or excessive wet-spreading of the conductive joint material from the above-described joint section during application of heat and pressure.

In the first preferred embodiment, as shown in FIGS. 1A, 1B, 2, and the like, the first resist film 1 is spaced away from the first electrode pad P11 with a gap provided between the first resist film 1 and the first electrode pad P11 (clearance resist structure). Accordingly, as compared to a case where the first resist film 1 covers some of the first electrode pad P11 (a case where the first resist film 1 has an over-resist structure with respect to the first electrode pad P11), the thickness of the first resist film 1 defining or functioning as a bank for the conductive joint material 5 is able to be easily adjusted. That is, the thickness of the first resist film 1 is able to be easily adjusted to a thickness that prevents the conductive joint material from being scattered or excessively wet-spread.

Further, in the first preferred embodiment, the first resist film 1 surrounds the whole circumference of the first electrode pad P11 in plan view of the main surface S1 (when viewed along the Z-axis). The first electrode pad P11 is surrounded by the first resist film 1. Therefore, as compared to a case where the first electrode pad P11 is not surrounded by the first resist film 1, scattering or excessive wet-spreading of the conductive joint material from the joint section during application of heat and pressure is able to be significantly reduced or prevented.

In the first preferred embodiment, the first insulating substrate 10 is flexible. Even when the first board 101 comes into contact with the second board 201 during application of heat and pressure by the hot bar 3, the first insulating substrate 10 is able to be deformed (for example, to define or function as a shock absorber) to significantly reduce or prevent damage to the first board 101 or the second board 201.

Note that, in the first preferred embodiment, a description has been provided of an example where the conductive paste 5P is applied (or printed) to the surface of the second electrode pad P21, but the present invention is not limited to these components, elements, and features, and the conductive paste 5P may be applied (or printed) to a surface of the first electrode pad P11.

In the first preferred embodiment, a description has been provided of a method to apply (or print) the conductive paste 5P to the surface of the first electrode pad P11 (or the surface of the second electrode pad P21) in the joining process. However, the surface of the first electrode pad P11 (or the surface of the second electrode pad P21) may be pre-coated with a predetermined amount of conductive paste. Adjusting, in advance, the amount of the conductive paste 5P with which the surface of the first electrode pad P11 (or the surface of the second electrode pad P21) is pre-coated is able to significantly reduce or prevent the scattering of the conductive joint material from the joint section during application of heat and pressure, as compared to a case where an excessive amount of the conductive joint material 5 is applied to the joint section.

Second Preferred Embodiment

In a second preferred embodiment of the present invention, a description will be provided of an example of the first board including a plurality of first electrode pads.

Figure 6A:
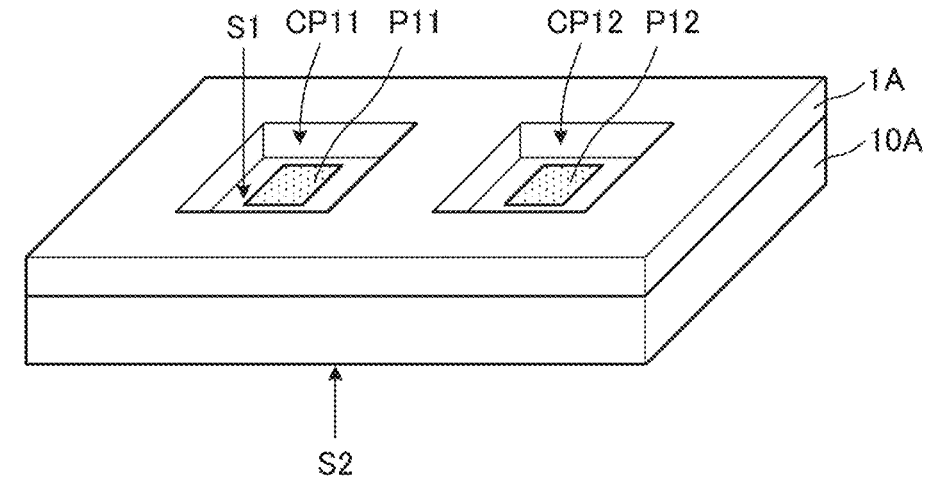
FIG. 6A is an external perspective view of a first board 102 according to a second preferred embodiment of the present invention.
Figure 6B:
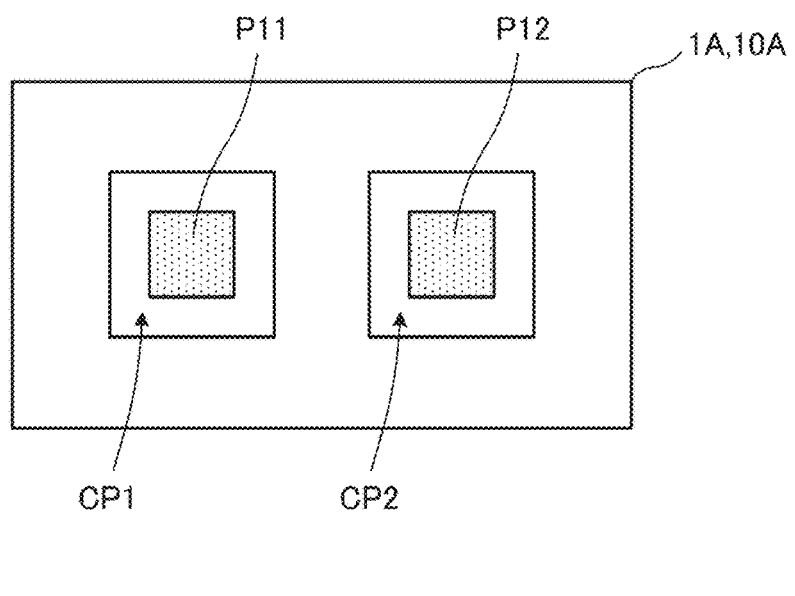
FIG. 6B is a plan view of the first board 102.
Figure 7:
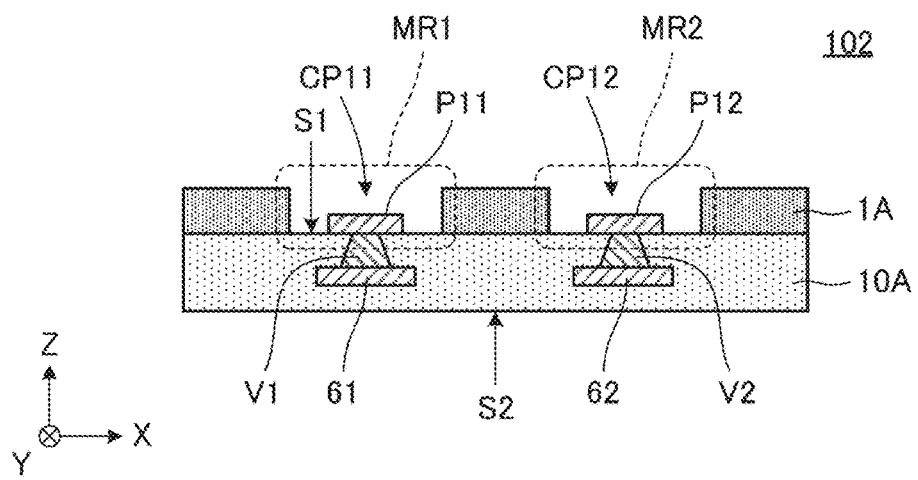
FIG. 7 is a cross-sectional view of the first board 102.

FIG. 6A is an external perspective view of a first board 102 according to a second preferred embodiment, and FIG. 6B is a plan view of the first board 102. FIG. 7 is a cross-sectional view of the first board 102. In FIGS. 6A and 6B, first electrode pads P11, P12 are shown in the form of a dot pattern for easy understanding of the structure.

The first board 102 includes a first insulating substrate 10A, the plurality of first electrode pads P11, P12, a first resist film 1A, first conductors 61, 62, interlayer connection conductors V1, V2, and the like. Note that the first board 102 includes components or elements (a conductor, a component, and the like) in addition to those described above, but the components or elements are not shown. The first board 102 differs from the first board 101 according to the first preferred embodiment in that the first board 102 includes the plurality of first electrode pads P11, P12, the first conductors 61, 62, and the interlayer connection conductors V1, V2.

A description will be provided below of differences from the first board 101 according to the first preferred embodiment.

The first insulating substrate 10A is a cuboid or substantially cuboid insulating element and includes main surfaces S1, S2 on opposite sides of the first insulating substrate 10A. Specifically, the first insulating substrate 10A is a resin flat plate including a laminate of a plurality of insulating substrate layers including a thermoplastic resin and having flexibility. The plurality of insulating substrate layers are preferably sheets primarily including, for example, a liquid crystal polymer (LCP) or polyetheretherketone (PEEK).

In the second preferred embodiment, the main surface S1 of the first insulating substrate 10A corresponds to the "first main surface".

The first electrode pads P11, P12 are rectangular or substantially rectangular conductor patterns provided on the main surface S1. The first electrode pads P11, P12 are located at, adjacent to, or in a vicinity of a center of the main surface S1 along a Y-axis and side by side along an X-axis.

The first resist film 1A is a protective film provided all or substantially all over the main surface S1 and located closer to the first electrode pads P11, P12 than any conductor provided on the main surface S1. The first resist film 1A includes openings CP11, CP12 at positions corresponding to the first electrode pads P11, P12, respectively. Therefore, providing the first resist film 1A on the main surface S1 exposes the first electrode pads P11, P12. As shown in FIGS. 6A, 6B, and 7, the first resist film 1A is spaced away from the first electrode pads P11, P12 with a gap provided between the first resist film 1A and the first electrode pads P11, P12. That is, the first resist film 1A has a clearance resist structure with respect to the first electrode pads P11, P12.

Note that, as shown in FIG. 6B, the first resist film 1A surrounds entire or substantially entire circumferences of the first electrode pads P11, P12 in plan view of the main surface S1 (when viewed along the Z-axis). Further, some of the first resist film 1A is located between the first electrode pads P11, P12.

The first conductors 61, 62 are conductor patterns provided in the first insulating substrate 10A. The interlayer connection conductors V1, V2 are provided in the first insulating substrate 10A. The first conductor 61 is electrically connected to the first electrode pad P11 via the interlayer connection conductor V1. The first conductor 62 is electrically connected to the first electrode pad P12 via the interlayer connection conductor V2. The first conductors 61, 62 are conductor patterns each preferably made of, for example, a Cu foil.

The first board 102 according to the second preferred embodiment has the following advantageous effects in addition to the advantageous effects described in the first preferred embodiment.

In the second preferred embodiment, at least some of the first resist film 1A defining or functioning as a bank for the conductive joint material is provided between the plurality of first electrode pads P11, P12. Therefore, even when the conductive joint material is scattered or the like from the joint section between the first electrode pads P11 and P12 during application of heat and pressure, a short circuit between the plurality of first electrode pads P11, P12 is able to be significantly reduced or prevented.

Further, in the second preferred embodiment, the first electrode pad P11 is electrically connected to the interlayer connection conductor V1 and the first conductor 61 provided in the first insulating substrate 10A. Further, the first electrode pad P12 is electrically connected to the interlayer connection conductor V2 and the first conductor 62 provided in the first insulating substrate 10A. As compared to a case where the first electrode pad is not electrically connected to either the first conductor or the interlayer connection conductor, the first electrode pads P11, P12 are less likely to separate from the surface of the first insulating substrate 10.

Note that, in the second preferred embodiment, a description has been provided of an example where the first electrode pads P11, P12 are electrically connected to the first conductors 61, 62 provided in the first insulating substrate 10A via the interlayer connection conductors V1, V2. However, the present invention is not limited to this example. Even when the first electrode pad is electrically connected to a conductor provided on the main surface S2 of the first insulating substrate 10A via the interlayer connection conductor, the same or similar advantageous effects as described above are able to be provided.

Third Preferred Embodiment

In a third preferred embodiment of the present invention, a description will be provided of an example where the second board is flexible.

Figure 8:
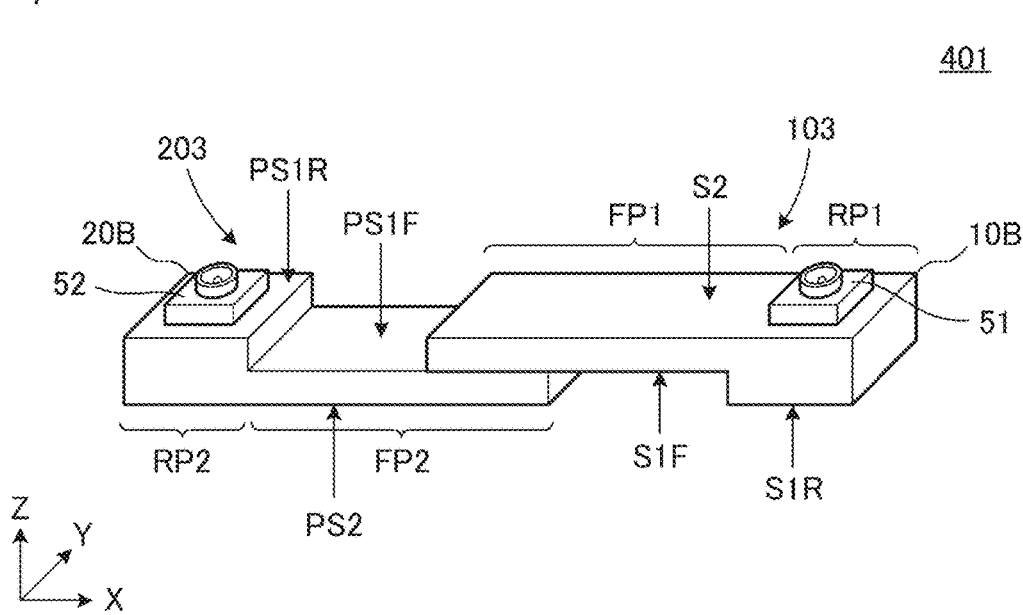
FIG. 8 is an external perspective view of a main portion of a cable 401 according to a third preferred embodiment of the present invention.

FIG. 8 is an external perspective view of a main portion of a cable 401 according to the third preferred embodiment. The cable 401 according to the third preferred embodiment is a flexible linear (long) cable and includes a first board 103 and a second board 203 joined together with a conductive joint material.

In the third preferred embodiment, the second board 203 corresponds to the "mounting board".

Figure 9:
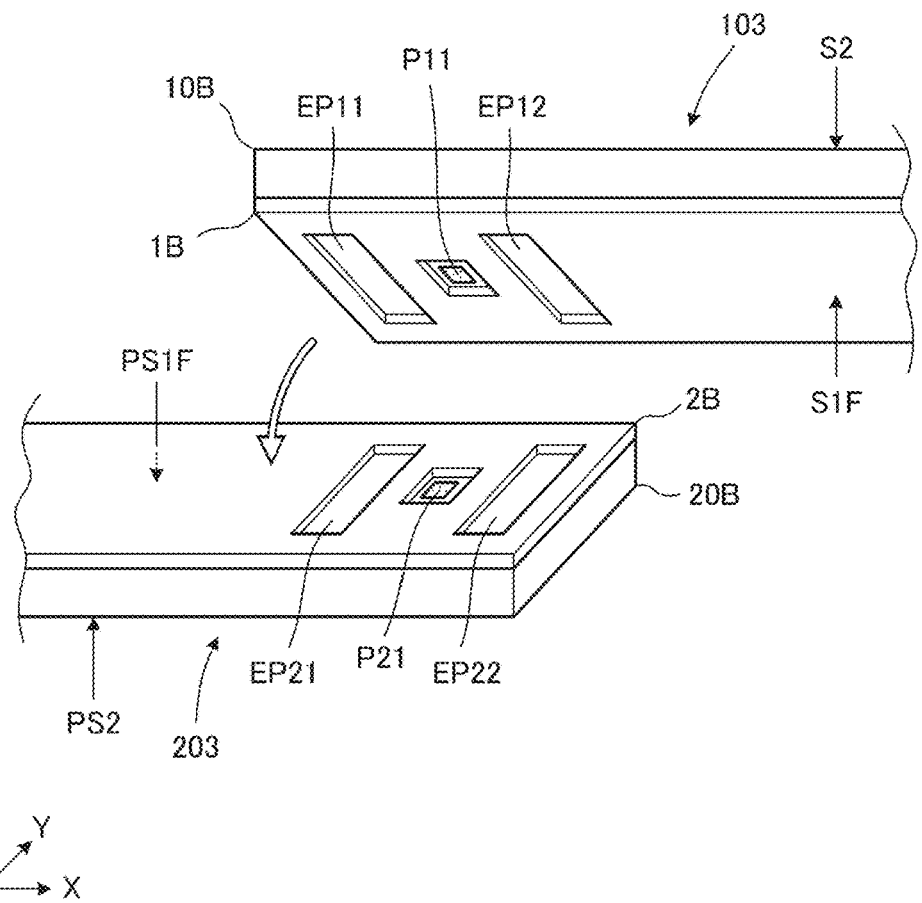
FIG. 9 is an enlarged exploded perspective view of a joint portion between a first board 103 and a second board 203 according to the third preferred embodiment of the present invention.

FIG. 9 is an enlarged exploded perspective view of a joint portion between the first board 103 and the second board 203 according to the third preferred embodiment. Note that, in FIG. 8, the first electrode pad P11 and the second electrode pad P21 are shown in the form of a dot pattern for easy understanding of the structure.

The first board 103 includes a first insulating substrate 10B, the first electrode pad P11, a first resist film 1B, a plurality of reinforcing electrode pads EP11, EP12, a connector 51, and the like. Note that the first board 103 includes a signal conductor, a ground conductor, and the like in addition to those described above, but they are not shown. The first board 103 differs from the first board 101 according to the first preferred embodiment in the shape of the first insulating substrate 10B. Further, the first board 103 differs from the first board 101 in that the first board 103 includes the plurality of reinforcing electrode pads EP11, EP12 and the connector 51.

A description will be provided below of differences from the first board 101 according to the first preferred embodiment.

The first insulating substrate 10B is a long (linear) insulating element whose longitudinal axis coincides with the X-axis and has main surfaces S1F, S1R and a main surface S2 on opposite sides of the first insulating substrate 10B. The first insulating substrate 10B is a resin flat plate including a laminate of a plurality of insulating substrate layers including a thermoplastic resin and having flexibility.

In the third preferred embodiment, the main surface S1F of the first insulating substrate 10B corresponds to the "first main surface".

In the third preferred embodiment, the X-axis corresponds to a "first direction".

As shown in FIG. 8, the first insulating substrate 10B includes a rigid portion RP1 and a flexible portion FP1. The rigid portion RP1 is larger in lamination number of insulating substrate layers than the flexible portion FP1. Therefore, the rigid portion RP1 is harder and stiffer than the flexible portion FP1. Further, the flexible portion FP1 is suppler and more flexible than the rigid portion RP1.

The first electrode pad P11 is a rectangular or substantially rectangular conductor pattern provided on the main surface S1. The first electrode pad P11 is electrically connected to the signal conductor (not shown) of the first board 103. The plurality of reinforcing electrode pads EP11, EP12 are linear conductor patterns provided on the main surface S1F and extending along the Y-axis. The plurality of reinforcing electrode pads EP11, EP12 are electrically connected to the ground conductor (not shown) of the first board 103.

The first electrode pad P11 and the plurality of reinforcing electrode pads EP11, EP12 are provided adjacent to or in a vicinity of a first end of the first insulating substrate 10B (a left end of the first insulating substrate 10B in FIG. 8). As shown in FIG. 9, the plurality of reinforcing electrode pads EP11, EP12 are provided with the first electrode pad P11 located between the reinforcing electrode pads EP11, EP12 along the X-axis in plan view of the main surface S1F (when viewed along the Z-axis).

The first resist film 1B is a protective film provided all or substantially all over the main surface S1F and located closer to the first electrode pad P11 than any conductor provided on the main surface S1F. The first resist film 1B includes an opening at a position corresponding to the first electrode pad P11. Providing the first resist film 1B on the main surface S1F exposes the first electrode pad P11 and the plurality of reinforcing electrode pads EP11, EP12. As shown in FIG. 9, the first resist film 1B is spaced away from the first electrode pad P11 with a gap provided between the first resist film 1B and the first electrode pad P11. That is, the first resist film 1 has a clearance resist structure with respect to the first electrode pad P11.

Note that, although not shown, the plurality of reinforcing electrode pads EP11, EP12 each correspond to some of the conductor pattern (corresponding to a "second conductor") provided on the main surface S1F that is not covered by the first resist film 1B. Specifically, the first resist film 1B includes openings at positions corresponding to the plurality of reinforcing electrode pads EP11, EP12. These openings are smaller in area than the conductor pattern. Therefore, providing the first resist film 1B on the main surface S1F exposes some (the reinforcing electrode pads EP11, EP12) of the conductor pattern. As described above, the first resist film 1B covers some of the conductor pattern provided on the main surface S1F. That is, the reinforcing electrode pads EP11, EP12 have an over-resist structure.

The connector 51 is mounted on the main surface S2 of the first insulating substrate 10B and is provided adjacent to or in a vicinity of a second end of the first insulating substrate 10B (a right end of the first insulating substrate 10B in FIG. 8). The connector 51 is electrically continuous with the signal conductor, the ground conductor, and the like of the first board 103 (not shown).

Next, a description will be provided of the second board. The second board 203 includes a second insulating substrate 20B, the second electrode pad P21, reinforcing electrode pads EP21, EP22, a second resist film 2B, a connector 52, and the like. Note that the second board 203 includes a signal conductor, a ground conductor, and the like in addition to those described above, but they are not shown. The second board 203 differs from the second board 201 according to the first preferred embodiment in the shape of the second insulating substrate 20B. Further, the second board 203 differs from the second board 201 in that the second board 203 includes the second resist film 2B, the plurality of reinforcing electrode pads EP21, EP22, and the connector 52.

A description will be provided below of differences from the second board 201 according to the first preferred embodiment.

The second insulating substrate 20B is a long (linear) insulating element whose longitudinal axis coincides with the X-axis and includes main surfaces PS1F, PS1R and a main surface PS2 on opposite sides of the second insulating substrate 20B. The second insulating substrate 20B is a resin flat plate including a laminate of a plurality of insulating substrate layers including a thermoplastic resin and having flexibility.

In the third preferred embodiment, the main surface PS1F of the second insulating substrate 20B corresponds to the "second main surface".

As shown in FIG. 8, the second insulating substrate 20B includes a rigid portion RP2 and a flexible portion FP2. The rigid portion RP2 is larger in lamination number of insulating substrate layers than the flexible portion FP2. Therefore, the rigid portion RP2 is harder and stiffer than the flexible portion FP2. Further, the flexible portion FP2 is suppler and more flexible than the rigid portion RP2.

The second electrode pad P21 is a rectangular or substantially rectangular conductor pattern provided on the main surface PS1F. The second electrode pad P21 is electrically connected to the signal conductor (not shown) of the second board 203. The plurality of reinforcing electrode pads EP21, EP22 are linear conductor patterns provided on the main surface PS1F and extending along the Y-axis. The plurality of reinforcing electrode pads EP21, EP22 are electrically connected to the ground conductor (not shown) of the second board 203.

The second electrode pad P21 and the plurality of reinforcing electrode pads EP21, EP22 are provided adjacent to or in a vicinity of a first end of the second insulating substrate 20B (a right end of the second insulating substrate 20B in FIG. 8). As shown in FIG. 9, the plurality of reinforcing electrode pads EP21, EP22 are provided with the second electrode pad P21 located between the reinforcing electrode pads EP21, EP22 along the X-axis in plan view of the main surface PS1F (when viewed along the Z-axis).

The second resist film 2B is a protective film provided all or substantially all over the main surface PS1F and located closer to the second electrode pad P21 than any conductor provided on the main surface PS1F. The second resist film 2B includes an opening at a position corresponding to the second electrode pad P21. Providing the second resist film 2B on the main surface PS1F exposes the second electrode pad P21. As shown in FIG. 9, the second resist film 2B is spaced away from the second electrode pad P21 with a gap provided between the second resist film 2B and the second electrode pad P21 (clearance resist structure). Note that, as shown in FIG. 9, the second resist film 2B surrounds the entire or substantially the entire circumference of the second electrode pad P21 in plan view of the main surface PS1F (when viewed along the Z-axis). The second resist film 2B is a solder resist film including a thermosetting resin such as an epoxy resin (EP) or a coverlay film including, for example, polyimide (PI) or polyethylene terephthalate (PET).

Note that, although not shown, the plurality of reinforcing electrode pads EP21, EP22 each correspond to some of the conductor pattern provided on the main surface PS1F that is not covered by the second resist film 2B. Specifically, the second resist film 2B includes openings at positions corresponding to the plurality of reinforcing electrode pads EP21, EP22. These openings are smaller in area than the conductor pattern. Therefore, providing the second resist film 2B on the main surface PS1F exposes some (the reinforcing electrode pads EP21, EP22) of the conductor pattern. As described above, the second resist film 2B covers some of the conductor pattern provided on the main surface PS1F (over-resist structure).

Further, although not shown, the second resist film 2B is preferably thicker than the second electrode pad P21.

The connector 52 is mounted on the main surface PS1R of the second insulating substrate 20B and is provided adjacent to or in a vicinity of a second end of the second insulating substrate 20B (a left end of the second insulating substrate 20B in FIG. 8). The connector 52 is electrically continuous with the signal conductor, the ground conductor, and the like of the second board 203 (not shown).

As shown in FIG. 9, the main surface S1F (first main surface) of the first board 103 faces the main surface PS1F (second main surface) of the second board 203 with the first resist film 1B and the second resist film 2B interposed between the main surface S1F and the main surface PS1F. The first electrode pad P11 of the first board 103 and the second electrode pad P21 of the second board 203 are joined together with a conductive joint material. Further, the reinforcing electrode pad EP11 of the first board 103 and the reinforcing electrode pad EP21 of the second board 203 are joined together with a conductive joint material. Furthermore, the reinforcing electrode pad EP12 of the first board 103 and the reinforcing electrode pad EP22 of the second board 203 are joined together with a conductive joint material (not shown). As described above, joining the first board 103 and the second board 203 together defines one cable 401.

The third preferred embodiment has the following advantageous effects in addition to the advantageous effects described in the first preferred embodiment.

The second board 203 according to the third preferred embodiment includes the second resist film 2B provided on the main surface PS1F and located closer to the second electrode pad P21 than any conductor provided on the main surface PS1F, with a gap provided between the second resist film 2B and the second electrode pad P21. Further, the second resist film 2B is thicker than the second electrode pad P21. The structure of the second electrode pad P21 joined to the first electrode pad P11 including a clearance resist structure further reduces or prevents scattering or excessive wet-spreading of the conductive joint material from the joint section during application of heat and pressure. This further reduces or prevents a change in characteristics due to scattering of the conductive joint material or the like.

In the third preferred embodiment, the insulating substrate (the first insulating substrate 10B or the second insulating substrate 20B) is flexible and long. When the board (for example, the first board) that is flexible and long is mounted on the mount board (for example, the second board) by reflow soldering, the board is likely to deform and shift in a mount position at the time of, for example, being mounted on the mount board. Accordingly, mounting the board on the mount board by a hot bar is suitable. Therefore, the advantageous features and effects obtained by providing the resist film of the present invention (the features and effects of significantly reducing or preventing scattering or wet-spreading of the conductive joint material during application of heat and pressure by the hot bar) are particularly effective when the insulating substrate is flexible and long.

Further, in the third preferred embodiment, the second insulating substrate 20B is flexible. Even when the first board 103 comes into contact with the second board 203 during application of heat and pressure by the hot bar, the second insulating substrate 20B is able to be deformed (for example, to define or function as a shock absorber) to significantly reduce or prevent damage to the first board 103 or the second board 203. Note that, in the third preferred embodiment, since both the first insulating substrate 10B and the second insulating substrate 20B are flexible, the above-described advantageous features and effects are further improved.

Boards, for example, cables are typically provided by manufacturing the boards as a mother board and then dividing the mother board into a plurality of pieces. However, when such a mother board is divided into long (or large) boards, the number of boards thus provided is small. On the other hand, in the third preferred embodiment, joining the first board 103 and the second board 203 together defines one cable 401 (composite board). That is, since joining small pieces (the first board and the second board) divided from the mother board together provides one large board, the number of boards provided from the mother board (the number of provided boards) is able to be increased.

Further, the cable 401 according to the third preferred embodiment is a flexible and long cable. Such a long cable is bent for general use. Thus, a joint portion between the first board 103 and the second board 203 may separate due to bending stress. In the third preferred embodiment, since the plurality of reinforcing electrode pads are provided at the joint portion, joint strength of the joint portion is able to be increased to significantly reduce or prevent the separation. Further, in the third preferred embodiment, since the electrode pad is interposed between the two reinforcing electrode pads, damage to the joint section between the electrode pads due to bending stress is able to be significantly reduced or prevented.

Further, since the electrode pad having a clearance resist structure is low in joint strength against the insulating substrate, the electrode pad easily separates from the surface of the insulating substrate. On the other hand, since the reinforcing electrode pad having an over-resist structure is high in joint strength against the insulating substrate as compared to the electrode pad having a clearance resist structure, the reinforcing electrode pad is less likely to separate from the surface of the insulating substrate. In particular, in the third preferred embodiment, since the electrode pad having a clearance resist structure is interposed between the plurality of reinforcing electrode pads having an over-resist structure, the separation of the joint section is able to be significantly reduced or prevented.

Further, in the third preferred embodiment, the first electrode pad P11 having a clearance resist structure (a structure where the resist film is spaced away from the electrode pad with a gap provided between the resist film and the electrode pad) is provided between the plurality of reinforcing electrode pads EP11, EP12. In other words, in the third preferred embodiment, the first electrode pad P11 located closer to a large number of pads than any conductor provided on the main surface S1F (for example, the reinforcing electrode pads EP11, EP12) has a clearance resist structure. Accordingly scattering of the conductive joint material from the joint section of the first electrode pad P11 during application of heat and pressure or the like is able to be significantly reduced or prevented, which in turn significantly reduces or prevents a short circuit between the large number of pads or the like. Therefore, even when the first electrode pad P11 is located closer to the large number of pads than any conductor provided on the main surface S1F, a change in characteristics due to, for example, scattering of the conductive joint material during application of heat and pressure is able to be significantly reduced or prevented. Note that the above-described features and effects hold true for the relationship between the second electrode pad P21 and the plurality of reinforcing electrode pads EP21, EP22.

In the third preferred embodiment, the longitudinal axis of the insulating substrate (the first insulating substrate 10B and the second insulating substrate 20B) coincides with the first direction (X-axis). When the longitudinal axis of the insulating substrate coincides with the first direction, bending stress including stress in the first direction generated when the insulating substrate deforms or bends tends to be applied to the joint portion between the first board 103 and the second board 203 (see a fourth preferred embodiment of the present invention as described below). Therefore, interposing the electrode pad between the plurality of reinforcing electrode pads in the first direction significantly reduces or prevents damage to the joint section between the electrode pads.

Fourth Preferred Embodiment

In a fourth preferred embodiment of the present invention, a description will be provided of an example that differs from the third preferred embodiment in the shape of the first board and the second board.

Figure 10:
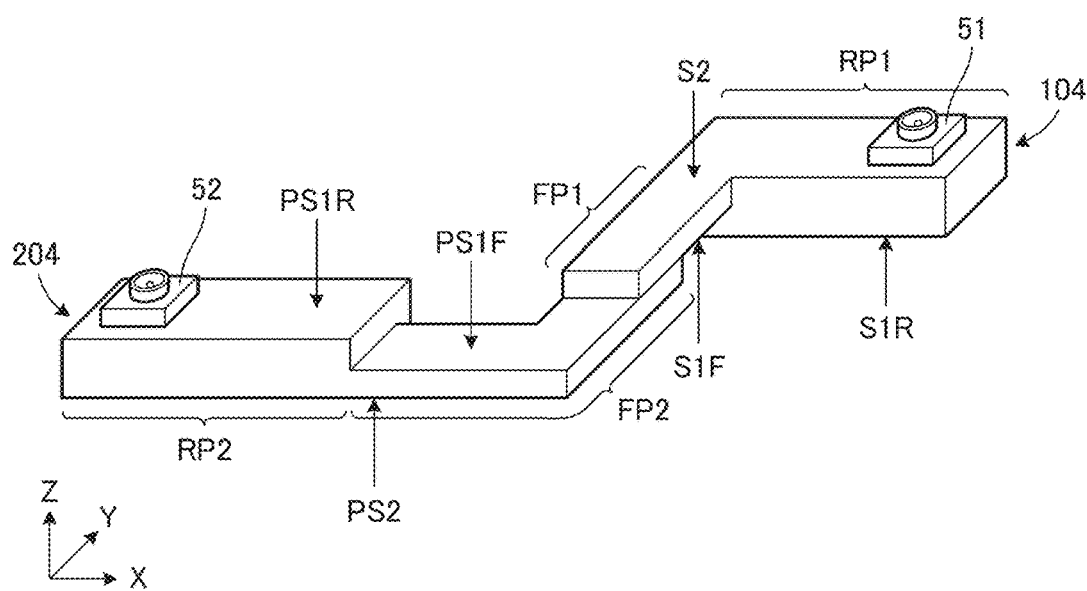
FIG. 10 is an external perspective view of a main portion of a cable 402 according to a fourth preferred embodiment of the present invention.

FIG. 10 is an external perspective view of a main portion of a cable 402 according to the fourth preferred embodiment. The cable 402 according to the fourth preferred embodiment is a flexible crank-shaped (long) cable including a first board 104 and a second board 204 joined together with a conductive joint material.

In the fourth preferred embodiment, the second board 204 corresponds to the "mounting board".

Figure 11:
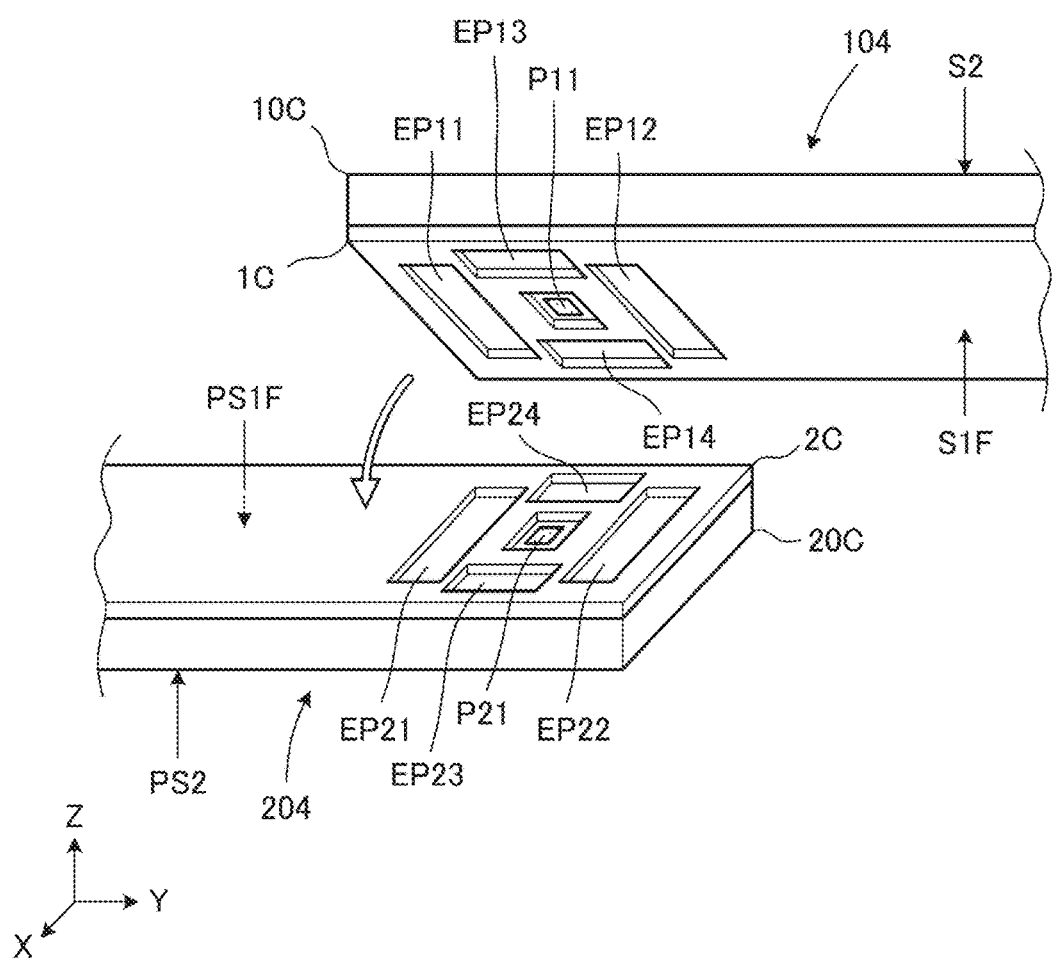
FIG. 11 is an enlarged exploded perspective view of a joint portion between a first board 104 and a second board 204 according to the fourth preferred embodiment of the present invention.

FIG. 11 is an enlarged exploded perspective view of a joint portion between the first board 104 and the second board 204 according to the fourth preferred embodiment. Note that, in FIG. 11, the first electrode pad P11 and the second electrode pad P21 are shown in the form of a dot pattern for easy understanding of the structure.

The first board 104 differs from the first board 103 according to the fourth preferred embodiment in shape of a first insulating substrate 10C. Further, the first board 104 differs from the first board 103 in that the first board 104 further includes reinforcing electrode pads EP13, EP14. The first board 104 is substantially identical in other components, elements, and features as the first board 103.

A description will be provided below of differences from the first board 103 according to the third preferred embodiment.

The first insulating substrate 10C is an L-shaped insulating flat plate whose longitudinal axis coincides with the X-axis and has main surfaces S1F, S1R and a main surface S2 on opposite sides of the first insulating substrate 10C.

In the fourth preferred embodiment, the main surface S1F of the first insulating substrate 10C corresponds to the "first main surface". Further, the X-axis corresponds to the "first direction", and the Y-axis corresponds to a "second direction".

The plurality of reinforcing electrode pads EP11, EP12 are linear conductor patterns provided on the main surface S1F and extending along the X-axis. The plurality of reinforcing electrode pads EP13, EP14 are linear conductor patterns provided on the main surface S1F and extending along the Y-axis. The plurality of reinforcing electrode pads EP11, EP12, EP13, EP14 are electrically connected to a ground conductor (not shown) of the first board 104.

The first electrode pad P11 and the plurality of reinforcing electrode pads EP11, EP12 are provided adjacent to or in a vicinity of a first end of the first insulating substrate 10C (a lower left end of the first insulating substrate 10C in FIG. 10). As shown in FIG. 11, the plurality of reinforcing electrode pads EP11, EP12 are provided with the first electrode pad P11 interposed between the reinforcing electrode pads EP11, EP12 along the Y-axis in plan view of the main surface S1F (when viewed along the Z-axis). The plurality of reinforcing electrode pads EP13, EP14 are provided with the first electrode pad P11 interposed between the reinforcing electrode pads EP13, EP14 along the X-axis in plan view of the main surface S1F (when viewed along the Z-axis).

A first resist film 1C is a protective film provided all or substantially all over the main surface S1F and located closer to the first electrode pad P11 than any conductor provided on the main surface S1F. The first resist film 1C is spaced away from the first electrode pad P11 with a gap provided between the first resist film 1C and the first electrode pad P11 (clearance resist structure).

Note that, although not shown, the plurality of reinforcing electrode pads EP11, EP12, EP13, EP14 each correspond to some of the conductor pattern (corresponding to the "second conductor") provided on the main surface S1F that is not covered by the first resist film 1C. Specifically, the first resist film 1C has openings at positions corresponding to the plurality of reinforcing electrode pads EP11, EP12, EP13, EP14. These openings are smaller in area than the second conductor. Therefore, providing the first resist film 1C on the main surface S1F exposes some (the reinforcing electrode pads EP11, EP12, EP13, EP14) of the second conductor. As described above, the first resist film 1C covers some of the second conductor provided on the main surface S1F (over-resist structure).

Next, a description will be provided of the second board. The second board 204 differs from the second board 203 according to the third preferred embodiment in shape of a second insulating substrate 20C. Further, the second board 204 differs from the second board 203 in that the second board 204 further includes reinforcing electrode pads EP23, EP24. The second board 204 is substantially identical in other components, elements, and features as the second board 203.

A description will be provided below of differences from the second board 203 according to the third preferred embodiment.

The second insulating substrate 20C is an L-shaped insulating flat plate whose longitudinal axis coincides with the X-axis and has main surfaces PS1F, PS1R and a main surface PS2 on opposite sides of the second insulating substrate 20C.

In the fourth preferred embodiment, the main surface PS1F of the second insulating substrate 20C corresponds to the "second main surface".

The plurality of reinforcing electrode pads EP21, EP22 are linear conductor patterns provided on the main surface PS1F and extending along the X-axis. The plurality of reinforcing electrode pads EP23, EP24 are linear conductor patterns provided on the main surface PS1F and extending along the Y-axis. The plurality of reinforcing electrode pads EP21, EP22, EP23, EP24 are electrically connected to a ground conductor (not shown) of the second board 204.

The second electrode pad P21 and the plurality of reinforcing electrode pads EP21, EP22 are provided adjacent to or in a vicinity of a first end of the second insulating substrate 20C (an upper right end of the second insulating substrate 20C in FIG. 10). As shown in FIG. 11, the plurality of reinforcing electrode pads EP21, EP22 are provided with the second electrode pad P21 interposed between the reinforcing electrode pads EP21, EP22 along the Y-axis in plan view of the main surface PS1F (when viewed along the Z-axis). The plurality of reinforcing electrode pads EP23, EP24 are provided with the second electrode pad P21 interposed between the reinforcing electrode pads EP23, EP24 along the X-axis in plan view of the main surface PS1F (when viewed along the Z-axis).

The second resist film 2C is a protective film provided all or substantially all over the main surface PS1F and located closer to the second electrode pad P21 than any conductor provided on the main surface PS1F. The second resist film 2C is spaced away from the second electrode pad P21 with a gap provided between the second resist film 2C and the second electrode pad P21 (clearance resist structure).

Note that, although not shown, the plurality of reinforcing electrode pads EP21, EP22, EP23, EP24 each correspond to some of the conductor pattern provided on the main surface PS1F that is not covered by the second resist film 2C. Specifically, the second resist film 2C has openings at positions corresponding to the plurality of reinforcing electrode pads EP21, EP22, EP23, EP24. These openings are smaller in area than the conductor pattern. Therefore, providing the second resist film 2C on the main surface PS1F exposes some (the reinforcing electrode pads EP21, EP22, EP23, EP24) of the conductor pattern. As described above, the second resist film 2C covers some of the conductor pattern provided on the main surface PS1F (over-resist structure).

As shown in FIG. 11, the main surface S1F (first main surface) of the first board 104 faces the main surface PS1F (second main surface) of the second board 204 with the first resist film 1C and the second resist film 2C interposed between the main surface S1F and the main surface PS1F. The first electrode pad P11 of the first board 104 and the second electrode pad P21 of the second board 204 are joined together with a conductive joint material. Further, the reinforcing electrode pad EP11 and the reinforcing electrode pad EP21 are joined together with a conductive joint material. Further, the reinforcing electrode pad EP12 and the reinforcing electrode pad EP22 are joined together with a conductive joint material. Further, the reinforcing electrode pad EP13 and the reinforcing electrode pad EP23 are joined together with a conductive joint material. Further, the reinforcing electrode pad EP14 and the reinforcing electrode pad EP24 are joined together with a conductive joint material (not shown). As described above, joining the first board 104 and the second board 204 together defines one cable 402.

Figure 12:
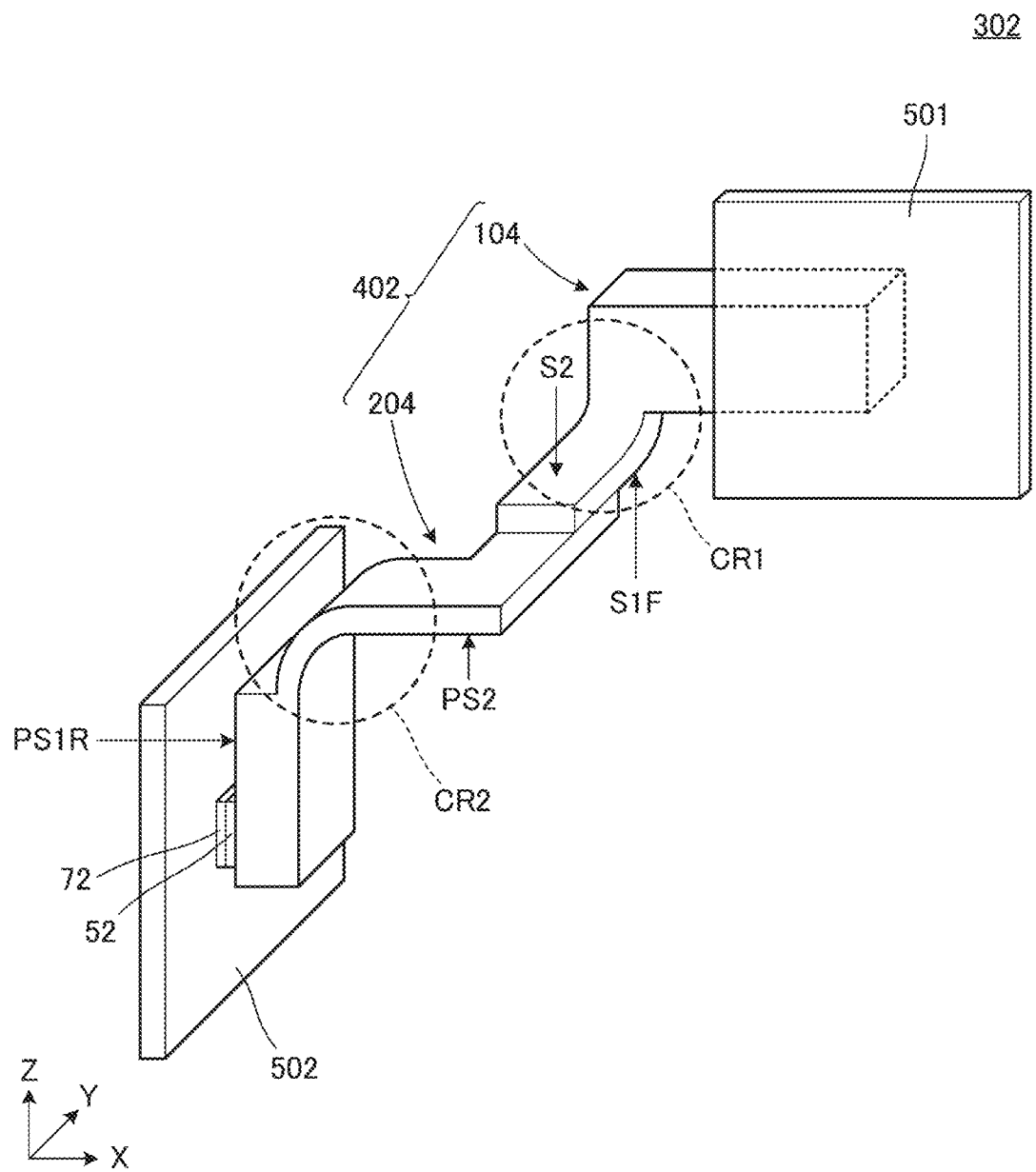
FIG. 12 is a perspective view of a main portion of an electronic device 302 according to the fourth preferred embodiment of the present invention.

The cable 402 according to the fourth preferred embodiment is used, for example, as follows. FIG. 12 is a perspective view of a main portion of an electronic device 302 according to the fourth preferred embodiment.

The electronic device 302 includes the cable 402, mount boards 501, 502, and the like. A large number of electronic components and the like are mounted on the mount boards 501, 502, but the electronic components and the like are not shown. The mount boards 501, 502 are, for example, printed wiring boards.

As shown in FIG. 12, the cable 402 has bent portions CR1, CR2. Specifically, the cable 402 is connected between the mount boards 501 and 502 with the flexible portions (the flexible portion FP1 of the first board 104 and the flexible portion FP2 of the second board 204 shown in FIG. 10) bent. The connector 51 of the cable 402 is connected to a receptacle (not shown) mounted on the mount board 501. The connector 52 of the cable 402 is connected to a receptacle 72 mounted on the mount board 502.

The fourth preferred embodiment has the following advantageous effects in addition to the advantageous effects described in the third preferred embodiment.

In the fourth preferred embodiment, the plurality of reinforcing electrode pads EP13, EP14 are provided with the first electrode pad P11 interposed between the reinforcing electrode pads EP13, EP14 along the first direction (X-axis) in plan view of the main surface S1F (when viewed along the Z-axis). Further, the plurality of reinforcing electrode pads EP11, EP12 are provided with the first electrode pad P11 interposed between the reinforcing electrode pads EP11, EP12 along the second direction (Y-axis) in plan view of the main surface S1F (when viewed along the Z-axis). The electrode pad being interposed between the four reinforcing electrode pads further reduces or prevents damage to the joint section of the electrode pad due to bending stress generated when the insulating substrate bends.

Other Preferred Embodiments

In each of the above preferred embodiments, examples where the first insulating substrate and the second insulating substrate are cuboid or substantially cuboid or L-shaped flat plates have been described, but the shapes of the first insulating substrate and the second insulating substrate may be changed within a scope in which the advantageous features and effects of the present invention are able to be provided. The first insulating substrate and the second insulating substrate may have, for example, a polygonal shape, a circular or substantially circular shape, an elliptical shape, a T-shape, a Y-shape, a crank shape, or the like in plan view.

In each of the above preferred embodiments, an example where the first insulating substrate is a resin flat plate primarily including a thermoplastic resin, or a laminate of a plurality of insulating substrate layers including a thermoplastic resin has been described, but the present invention is not limited to these specific components, elements, and features. The first insulating substrate may be, for example, a flat plate including a thermosetting resin such as, for example, an epoxy resin or may be a dielectric ceramic such as a low temperature co-fired ceramic (LTCC). Further, the first insulating substrate may be a composite laminate of a plurality of resins, and, for example, may include a laminate of a thermosetting resin such as a glass/epoxy substrate and a thermoplastic resin. Further, the first insulating substrate that is a laminate is not limited to surfaces being fused together by applying heat and pressure to a laminate of a plurality of insulating substrate layers, and an adhesive layer may be provided between the insulating substrate layers. Note that the second insulating substrate is not limited to the specific components, elements, and features described in each of the preferred embodiments, as with the above-described first insulating substrate.

Further, in each of the above preferred embodiments, an example where the first electrode pads P11, P12 and the second electrode pad P21 are rectangular or substantially rectangular conductor patterns has been described, but the present invention is not limited to these specific components, elements, and features. The shape, number, and the like of the first electrode pads and the second electrode pads may be changed within a scope in which the advantageous features and effects of the present invention are able to be provided. The first electrode pad and the second electrode pad may have, for example, a linear shape, a polygonal shape, a circular or substantially circular shape, an elliptical shape, an arc shape, an annular shape, an L-shape, a T-shape, a Y-shape, a crank shape, or the like.

In each of the above preferred embodiments, an example where the board (the first board and the second board) includes two or four linear reinforcing electrode pads has been described, but the shape, number, and the like of the reinforcing electrode pads may be changed within a scope in which the advantageous features and effects of the present invention are able to be provided. The reinforcing electrode pads may have, for example, a linear shape, a polygonal shape, a circular or substantially circular shape, an elliptical shape, an arc shape, an annular shape, an L-shape, a T-shape, a Y-shape, a crank shape, or the like.

Note that, for example, a conductor pattern other than the signal conductor or the ground conductor may be provided on the first board (board) or the second board (mounting board). Further, a frequency filter, for example, an inductor, a capacitor, or any type of filter (a low-pass filter, a high-pass filter, a band-pass filter, a band elimination filter) may include a conductor pattern on the first board or the second board. Further, various transmission lines (for example, a strip line, a microstrip line, a coplanar line, and the like) may be provided on the first board or the second board.

Further, various components, for example, a chip component may be mounted on (or embedded in) the first board (board) or the second board (mounting board).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A board joint structure comprising:
   a board; and
   a mounting board; wherein
   the board includes:
      a first insulating substrate including a first main surface;
      a first electrode pad provided on the first main surface;
      a first resist film provided on the first main surface and located closer to the first electrode pad than any conductor provided on the first main surface; and a plurality of reinforcing electrode pads provided on the first main surface;

the first resist film is spaced away from the first electrode pad with a gap provided between the first resist film and the first electrode pad and is thicker than the first electrode pad;

the mounting board includes:
- a second insulating substrate including a second main surface;
- a second electrode pad provided on the second main surface; and
- a plurality of reinforcing electrode pads provided on the second main surface;

the first main surface faces the second main surface with the first resist film interposed between the first main surface and the second main surface;

the first electrode pad and the second electrode pad are joined together with a conductive joint material;

the first electrode pad is provided between the plurality of reinforcing electrode pads provided on the first main surface along an X-axis in plan view of the first main surface and between the plurality of reinforcing electrode pads provided on the first main surface along a Y-axis in plan view of the first main surface; and the second electrode pad is provided between the plurality of reinforcing electrode pads provided on the second main surface along the X-axis in plan view of the second main surface and between the plurality of reinforcing electrode pads provided on the second main surface along the Y-axis in plan view of the second main surface.

2. The board joint structure according to claim 1, wherein
the first electrode pad is electrically connected to a signal conductor of the board; and
the second electrode pad is electrically connected to a ground conductor of the board.

3. The board joint structure according to claim 1, wherein the board includes a bent portion.

4. The board joint structure according to claim 1, wherein the mounting board includes a bent portion.

5. The board joint structure according to claim 1, wherein the mounting board includes a second resist film provided on the second main surface and located closer to the second electrode pad than any conductor provided on the second main surface;

the second resist film is spaced away from the second electrode pad with a gap provided between the second resist film and the second electrode pad and is thicker than the second electrode pad; and the first main surface faces the second main surface with the first resist film and the second resist film interposed between the first main surface and the second main surface.

6. The board joint structure according to claim 1, wherein the first insulating substrate is flexible.

7. The board joint structure according to claim 1, wherein the second insulating substrate is flexible.

8. The board joint structure according to claim 1, wherein the first insulating substrate is a resin flat plate including a thermoplastic resin.

9. The board joint structure according to claim 1, wherein the first electrode pad is a Cu foil.

10. The board joint structure according to claim 1, wherein the first resist film includes an opening in which the first electrode pad is exposed.

11. The board joint structure according to claim 10, wherein the first resist film surrounds an entire or substantially an entire circumference of the first electrode pad in plan view of the first main surface.

12. The board joint structure according to claim 1, wherein the first resist film is a solder resist film including a thermosetting resin.

13. The board joint structure according to claim 1, wherein
the first electrode pad is one of a plurality of first electrode pads provided on the first main surface; and
each of the plurality of first electrode pads is located closer to the first resist film than any conductor provided on the first main surface.

14. The board joint structure according to claim 1, wherein
the board further includes a conductor and an interlayer connector conductor; and
the first electrode pad is electrically connected to the conductor by the interlayer connection conductor.

* * * * *